(12) United States Patent
Yamaguchi et al.

(10) Patent No.: US 7,893,740 B2
(45) Date of Patent: Feb. 22, 2011

(54) DATA SIGNAL GENERATING APPARATUS

(75) Inventors: Kazuhiko Yamaguchi, Isehara (JP);
Kazuhiro Fujinuma, Ebina (JP)

(73) Assignee: Anritsu Corporation, Atsugi-shi (JP)

( * ) Notice: Subject to any disclaimer, the term of this patent is extended or adjusted under 35 U.S.C. 154(b) by 163 days.

(21) Appl. No.: 12/295,208

(22) PCT Filed: Mar. 26, 2007

(86) PCT No.: PCT/JP2007/056241
§ 371 (c)(1),
(2), (4) Date: Dec. 11, 2008

(87) PCT Pub. No.: WO2007/116695
PCT Pub. Date: Oct. 18, 2007

(65) Prior Publication Data
US 2009/0243680 A1    Oct. 1, 2009

(30) Foreign Application Priority Data
Mar. 31, 2006  (JP) ............................. 2006-099910
Mar. 31, 2006  (JP) ............................. 2006-099911

(51) Int. Cl.
*H04L 7/00* (2006.01)
(52) U.S. Cl. ...................... 327/161; 327/141
(58) Field of Classification Search ................. 327/161, 327/162, 163, 141, 144, 145
See application file for complete search history.

(56) References Cited
U.S. PATENT DOCUMENTS
5,905,391 A * 5/1999 Mooney ..................... 327/161

6,653,877 B2 * 11/2003 Tsujino ....................... 327/161
6,861,886 B1 * 3/2005 Ludden et al. ............... 327/156
7,471,128 B2 * 12/2008 Shutoku et al. ............. 327/158
2005/0129158 A1    6/2005 Kuwata FOREIGN PATENT DOCUMENTS
JP    A 59-190709    10/1984
JP    A 11-163608    6/1999
WO    WO 2004/040835 A1    5/2004

OTHER PUBLICATIONS
VSC1237, VSC1238; [online], Aug. 11, 2004; Vitesse Semiconductor Corporation, Mar. 23, 2007; Internet.

* cited by examiner

*Primary Examiner*—Hai L Nguyen
(74) *Attorney, Agent, or Firm*—Greer, Burns & Crain, Ltd.

(57) ABSTRACT

A data signal generating apparatus with a data output unit for outputting m-bit parallel data and a data synchronization clock signal synchronized with the parallel data in response to a data request signal produced by dividing the frequency of a reference clock signal by "m." An m:1 multiplexer for receiving the parallel data in response to a latch signal produced by dividing the frequency of the reference clock signal by "m," and outputting, at a rate of the reference clock signal, data synchronization serial data. Synchronization means for comparing the phases of the data synchronization clock signal and the latch signal, for synchronizing the parallel data with the latch signal, and for producing a control signal, and which delays, on the basis of the control signal, the reference clock signal or a divided clock signal (dividing the frequency of the reference clock signal by "m" or less).

3 Claims, 15 Drawing Sheets

DATA SIGNAL GENERATING APPARATUS

This application is a U.S. National Phase under 35 U.S.C. §371, of International Application No. PCT/JP2007/056241, filed Mar. 26, 2007.

FIELD OF THE INVENTION

The present invention relates to a data signal generating apparatus for converting, by using a multiplexer, parallel data into serial data to be outputted at a high speed, and more particularly to a data signal generating apparatus small in size, and capable of synchronizing parallel data to be produced by the data output unit in an automatic manner, and perform parallel-serial conversion processing without being affected by the delay of the parallel data.

BACKGROUND OF THE INVENTION

In general, a data signal generating apparatus such as PPG (pulse pattern generator) converts, by using a multiplexer, low speed parallel data into high speed serial data, and to output the serial data.

FIG. 11 is a block diagram showing the fundamental construction of the data signal generating apparatus 10 provided with a multiplexer.

As shown in FIG. 11, a data output unit 11 has a memory unit (not shown) having a series of data string stored therein, the data string having a predetermined pattern, or a processing circuit (not shown) for producing a series of data string. The data output unit 11 is operative to output m-bit of data in parallel every time receiving a data request signal A.

A multiplexer 13 has a switch unit 13a for selecting the data, a controller 13b for controlling the change-over operation of the switch unit 13a, and a latch circuit 13c for latching the data inputted in parallel, and outputting the data to the switch unit 13a. The multiplexer 13 is operative to latch m-bits of parallel data outputted from the data output unit 11 and to output the data by one bit as selected serial data in a desired sequence in synchronism with a high speed reference clock signal CK1.

The controller 13b is operative to output a data request signal A produced by dividing the frequency of the reference clock signal CK1 with a number "m" to request a following parallel data every time the data selection by the switch unit 13a is performed (every time the number "m" of the data are outputted). Immediately after the data request signal A is outputted by the controller 13b, the latch signal B is inputted to the latch circuit 13c by the controller 13b.

Here, it is assumed that for example the number "m" is four. In this case, it is also assumed that in response to the reference clock signal CK1 shown in FIG. 12(a), the data request signal A (rising edge) is outputted to the data output unit 11 at a timing shown in FIG. 12(b). In response to the data request signal A, four bits of parallel data d(0, 0) to d(0, 3) shown in FIGS. 12(c) to 12(f) are produced in a state with entirely no delay times by the data output unit 11 to be inputted to a multiplexer 13.

At a timing elapsed by a somewhat time Δt after the data request signal A is outputted, a latch signal B (rising edge) shown in FIG. 12(g) is outputted to the latch circuit 13c to have the parallel data d(0, 0) to d(0, 3) shown in FIGS. 12(h) to 12(k) given to the switch unit 13a. The switch unit 13a is operable to be changed at each of the falling edge of the reference clock signal CK1 from after the latch signal B is outputted, i.e., at each of the times t00, t01, t02. and t03 to output the data d(0, 0), d(0, 1), d(0, 2), d(0, 3) shown in FIG. 12(i) in this sequence. Afterward, the above operation is repeated to lead to the outputting operation of the serial data in a desired pattern.

The above operational example shown in FIG. 12 has been raised and explained to have no delay times or to be in an ignored delay times between the multiplexer 13 and the data output unit 11, however, there is generally generated a relatively long delay time from the time the data request signal A is received by the data output unit 11 to the time the new parallel data are outputted to the latch circuit 13c due to the fact that the data output unit 11 is in reality constituted partly by a memory. The delay time occurs depending upon the length of each line to transmit the data request signal A and the parallel data Dp. The total of the delay times Td is a level of a few nanos/second (ns) at the smallest.

On the other hand, assuming for example that the frequency f1 of the reference clock signal CK1 is 10 GHz, the previously mentioned delay time Td is a few tenth the frequency T1 (0.1 ns) of the reference clock signal CK1. If the delay time is equal to the m-th (m-multiple) the frequency T1 of the reference clock signal CK1 or the integer k-th (integer k-multiple) the frequency T1 of the reference clock signal CK1, there is generated a state the same as the state shown in FIG. 12 in which the serial data Ds are outputted by the switch unit 13a in the desired sequence as described above.

When, on the other hand, the above delay time becomes equal to mkt+Δt. viz., the data updating timing of the data inputted to the multiplexer 13 from the data output unit 11 is coincident with the reading timing (latch timing), the reading timing of the multiplexer 13 for each of all the bits of the data comes to be unstable so that the desired serial data Ds are not outputted by the multiplexer 13.

On of the known multiplexer is constructed to convert the parallel data into the serial data after the parallel data are latched at one time as described above, and the other of the known multiplexer is constructed to latch the parallel data at a time difference equal to the period of the latching operation of the parallel data in some series sequence in synchronism with the reference clock signal CK1 and then to output as the serial data. In the two known multiplexer, the latching timings of the some series of the parallel data are overlapped with the data updating timings so that there are given rise to some cases in which the output data of the series of the parallel data are unstable and in which the sequence of the output data is brought out of the desired sequence.

As one of known methods to solve these problems, there is a method in which the reference clock signal CK1 is inputted to the multiplexer 13 at a delay time of Td by a delay device 14, and in which the reference clock signal CK1 is divided by 1/m by a frequency divider 15 before the divided reference clock signal CK1 is inputted to the data output unit 11 as a data request signal. The frequency divider 15 thus used in this manner is disclosed for example in the patent document 1 as described below.

As the other alternative known method, there is another proposed method which is disclosed for example in the non-patent document 1 as described below. In the method disclosed in the document 1, in the case that the data output unit 11 is constructed to output a data synchronism clock in synchronism with the updating timing of the parallel data, the phase difference between the divided clock signal CK2 produced by dividing the frequency of the reference clock signal CK1 by the number "m" with a frequency divider 15 and the data synchronism clock CKp outputted from the data output unit 11 is detected to produce a detection signal by a phase comparator 16. The detection signal serves to control VCO 17 oscillating and outputting a data request signal A' having a frequency f/m in the PLL construction as shown in FIG. 15.

Patent document 1: Japanese Patent Laid-Open Publication No. H11-163608

Non-patent document 1: "VSC1237, VSC1238", [online], Aug. 11, 2004, Vitesse Semiconductor Corporation, [Mar. 23, 2007], Internet.

DISCLOSURE OF THE INVENTION

Problems to be Solved by the Invention

The above-mentioned method using the delay device 14, however, encounters such a problem that the apparatus is apt to be large in size due to the fact that a large space is needed for the delay device to use a long wiring for securing the delay time. The delay device thus constructed has a changed delay time depending upon its environment temperature and thus needs to be provided with a compensation mechanism for compensating the changed temperature. For this reason, the apparatus becomes larger in size.

In the case of the PLL construction as described above, the output data rate is limited to the frequency variable range of the VCO17. The fact that the PLL-controlled output data of the VCO17 is a data request signal A' results in the fact that when the reference clock signal CK1 is intentionally given jitter for confirmation of the operation of the measurement object, the PLL control causes the jitter to be decreased, thereby making it impossible to accurately measure.

It is, therefore, an object of the present invention to provide a data signal generating apparatus which is small in size, and can output the serial data in a desired sequence without assuming an indefinite state as well as being capable of dealing with the jitter measurement.

Means for Solving the Problems

The data signal generating apparatus according to the present invention comprises: a data output unit (11) for outputting m-bit parallel data and a data synchronization clock signal synchronized with the m-bit parallel data in response to a data request signal produced by dividing the frequency of a reference clock signal by a plural number "m": a m:1 multiplexer (13) for receiving the m-bit parallel data from the data output unit in response to a latch signal produced by dividing the frequency of the reference clock signal by the plural number "m", and outputting, at a rate of the reference clock signal, a data synchronization serial data produced from the m-bit parallel data; and synchronization means (25) having a phase comparator (16) for comparing the phase of the data synchronization clock signal with the phase of the latch signal, the synchronization means being operative to synchronize the m-bit parallel data outputted from the data outputting unit with the latch signal, wherein the synchronization means includes: a control unit (26) for producing a control signal based on a comparing result obtained by the phase comparator; and a variable delay device (30) for delaying, on the basis of the control signal, the reference clock signal or a divided clock signal produced by dividing the frequency of the reference clock signal by a number equal to or smaller than the plural number "m".

The variable delay device (30) may be constituted by an orthogonal modulation type delay device.

The variable delay device (30) may include: a phase shifter (31) for receiving, as an input signal, the reference clock signal or the divided clock signal produced by dividing the frequency of the reference clock signal by the number equal to or smaller than the plural number "m", and outputting two signals different in phase from each other by 90 degrees; a first mixer (32) for multiplying one of the signals outputted from the phase shifter by a first direct voltage; a second mixer (33) for multiplying the other of the signals outputted from the phase shifter by a second direct voltage; and adding means (34) for outputting a signal produced by adding an output signal of the first mixer to an output signal of the second mixer, and delayed on the basis of a ratio of the first and second direct voltages.

The phase shifter is constituted by a flip-flop circuit (31') for outputting two signals different in phase from each other by 90 degrees.

The data signal generating apparatus according to claim 1, may further comprise: at least one systematically-expanded data conversion unit having a m:1 multiplexer (13) and a synchronization means (40), wherein the data output unit may be operative to output the data synchronization clock signal to the synchronization means of the systematically-expanded data conversion unit, and to output the m-bit parallel data synchronized with the data synchronization clock signal to the m:1 multiplexer of the systematically-expanded data conversion unit, and the synchronization means of the systematically-expanded data conversion unit may be operative to synchronize the data synchronization clock signal with the latch signal produced in the m:1 multiplexer.

The synchronization means of the systematically-expanded data conversion unit may have: a phase comparator (42) for comparing the phase of the data synchronization clock signal with the phase of the latch signal; a control unit (43) for producing a control signal on the basis of the comparing result obtained by the phase comparator; and a variable delay device (41) for adding a delay based on the control signal to the reference clock signal.

The variable delay device of the systematically-expanded synchronization means may be constituted by an orthogonal modulation type delay device.

Advantageous Effect of the Invention

The data signal generating apparatus according to the present invention is operative to compare the phase of a data synchronization clock signal outputted from a data output unit in synchronization with the timing to update parallel data, with the phase of a divided clock signal produced by dividing the frequency of a reference clock signal by a plural number "m", to add a delay based on this comparing result to a data request signal to be inputted to the data output unit, and to synchronize the timing to have the data output unit update the parallel data with the timing to have the multiplexer perform parallel-serial conversion processing.

Therefore, the data signal generating apparatus according to the present invention is small in size, and can synchronize the timing to have the data output unit update the parallel data with the timing to have the multiplexer perform parallel-serial conversion processing with a wide range of bit rate, and deal with the jitter measurement.

EXPLANATION OF THE REFERENCE NUMERALS

Figure 1:
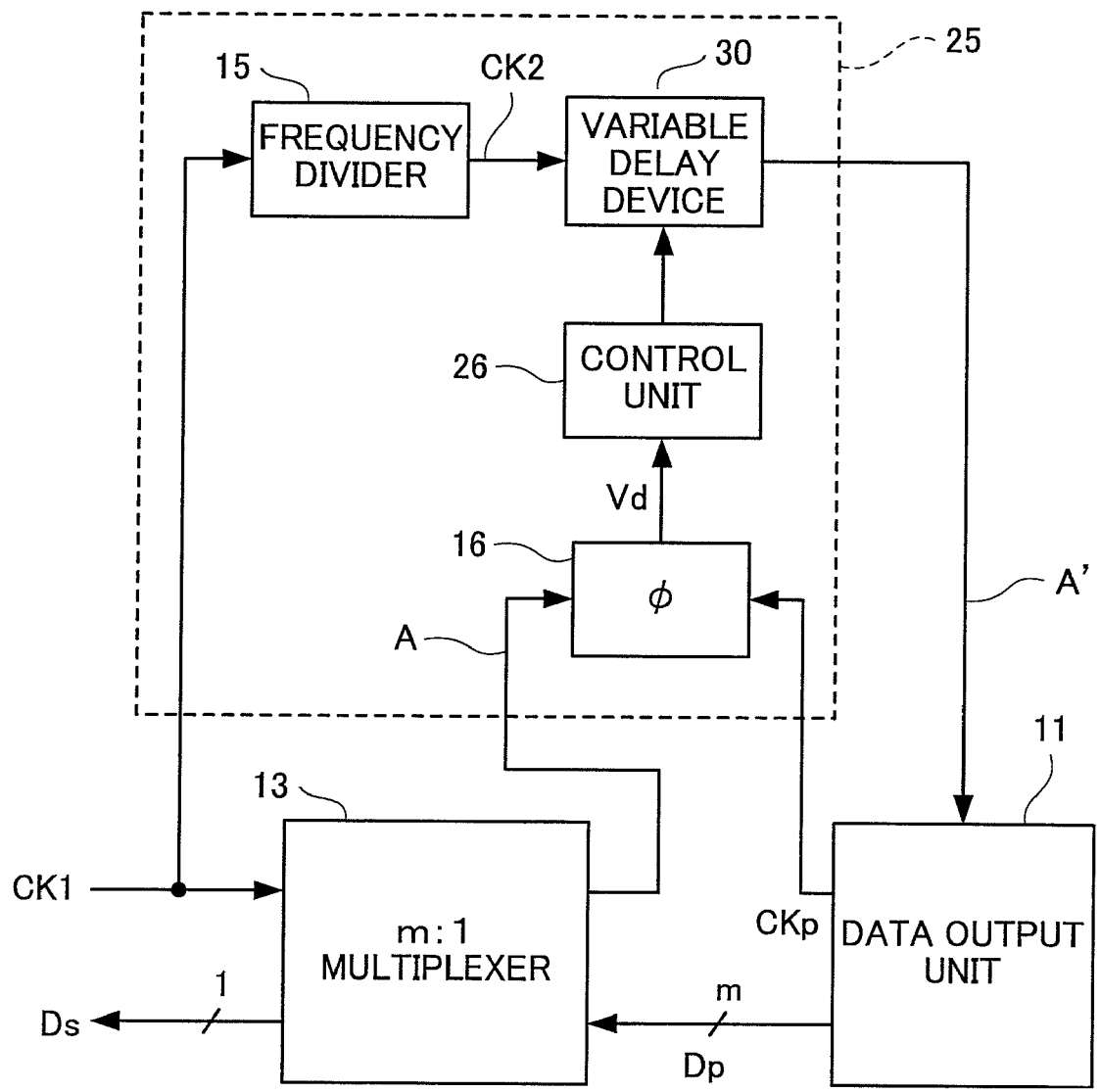
FIG. 1 is a block diagram showing a data signal generating apparatus according to the first embodiment of the present invention.

11: data output unit
13: multiplexer
15: frequency divider
16, 42: phase comparator
20, 50: data signal generating apparatus
23($i$) to 23($n$): data converter
25, 40: synchronization means
26, 43: control unit
30, 41: variable delay device
37$b$: slave stage 31': T-type flop-flip
31$a$: master stage
31: phase shifter
32, 33: mixer
34: adder
41, 42: frequency divider
51: jitter adding means

PREFERRED EMBODIMENT OF THE INVENTION

The first to seventh embodiments of the data signal generating apparatus according to the present invention will be described hereinafter with reference to accompanying drawings.

First Embodiment

FIG. 1 is a block diagram showing the construction of the data signal generating apparatus 20 according to the first embodiment of the present invention. In the data signal generating apparatus 20, a data output unit 11, a multiplexer 13, a frequency divider 15, and a phase comparator 16 are the same in construction as those of the above-mentioned conventional data signal generating apparatus, and bear the same reference numbers as those of the above-mentioned conventional data signal generating apparatus.

In the data signal generating apparatus 20 according to the first embodiment, synchronization means 25 for maintaining a synchronizing state to accurately synchronize the timing to update parallel data to be inputted into the multiplexer 13 with the timing to have multiplexer 13 perform the parallel-serial conversion processing includes a frequency divider 15, a phase comparator 16, a control unit 26, and a variable delay device 30. The synchronizing state are intended to mean an operational state in which the timing to have multiplexer 13 perform the parallel-serial conversion processing is not overlapped with the timing to update parallel data to be inputted into the multiplexer 13, and in which the serial data are outputted in a desired sequence. The timing to have the multiplexer 13 read the parallel data includes both the lump latch and every series latch.

The frequency divider 15 produces a divided clock signal CK2 by dividing the frequency of a reference clock signal CK1 by a plural number "m", and inputs the divided clock signal CK2 into the variable delay device 30.

On the other hand, the phase comparator 16 receives a data request signal A from the multiplexer 13, receives a data synchronization clock signal CKp synchronized with the timing to update the parallel data from the data output unit 11, and detects a phase difference between the data request signal A and the data synchronization clock signal CKp.

The data request signal A inputted into the phase comparator 16 is defined by a signal produced by dividing the frequency of the reference clock signal CK1 by the controller 13$b$ in the multiplexer 13 to serve to decide the timing to perform the parallel-serial conversion processing by the multiplexer 13.

Figure 2:
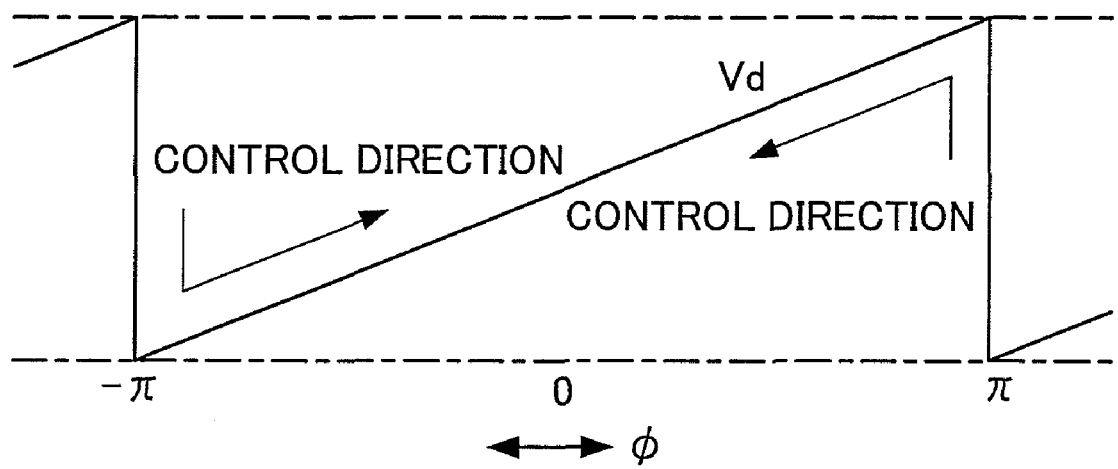
FIG. 2 is a schematic diagram for explaining an operation of the main portion of the data signal generating apparatus according to the first embodiment of the present invention.

Here, the phase comparator 16 has a property required to have a detection signal Vd linearly increase when, for example, the phase difference φ between two input signals is changed from −π to +π as shown in FIG. 2.

The control unit 26 receives the detection signal Vd from the phase comparator 16 to control the variable delay device 30 to ensure that the detection signal Vd is within a predetermined range, viz., the phase difference between the data synchronization clock signal CKp and the data request signal A is within a range defined in the vicinity of zero.

The variable delay device 30 adds a desired delay to the data request signal A' to be inputted to the data output unit 11. In this embodiment, the variable delay device 30 is operated to delay the divided clock signal CK2 produced by dividing the frequency of the reference clock signal CK1 by the number "m" and to output the divided clock signal CK2 to the data output unit 11 as a data request signal A'.

As one of the variable delay device 30, the data signal generating apparatus uses an orthogonal modulation device type of variable delay device which can realize a wide range of delay processing operation with a circuit construction relatively small in scale.

Figure 3:
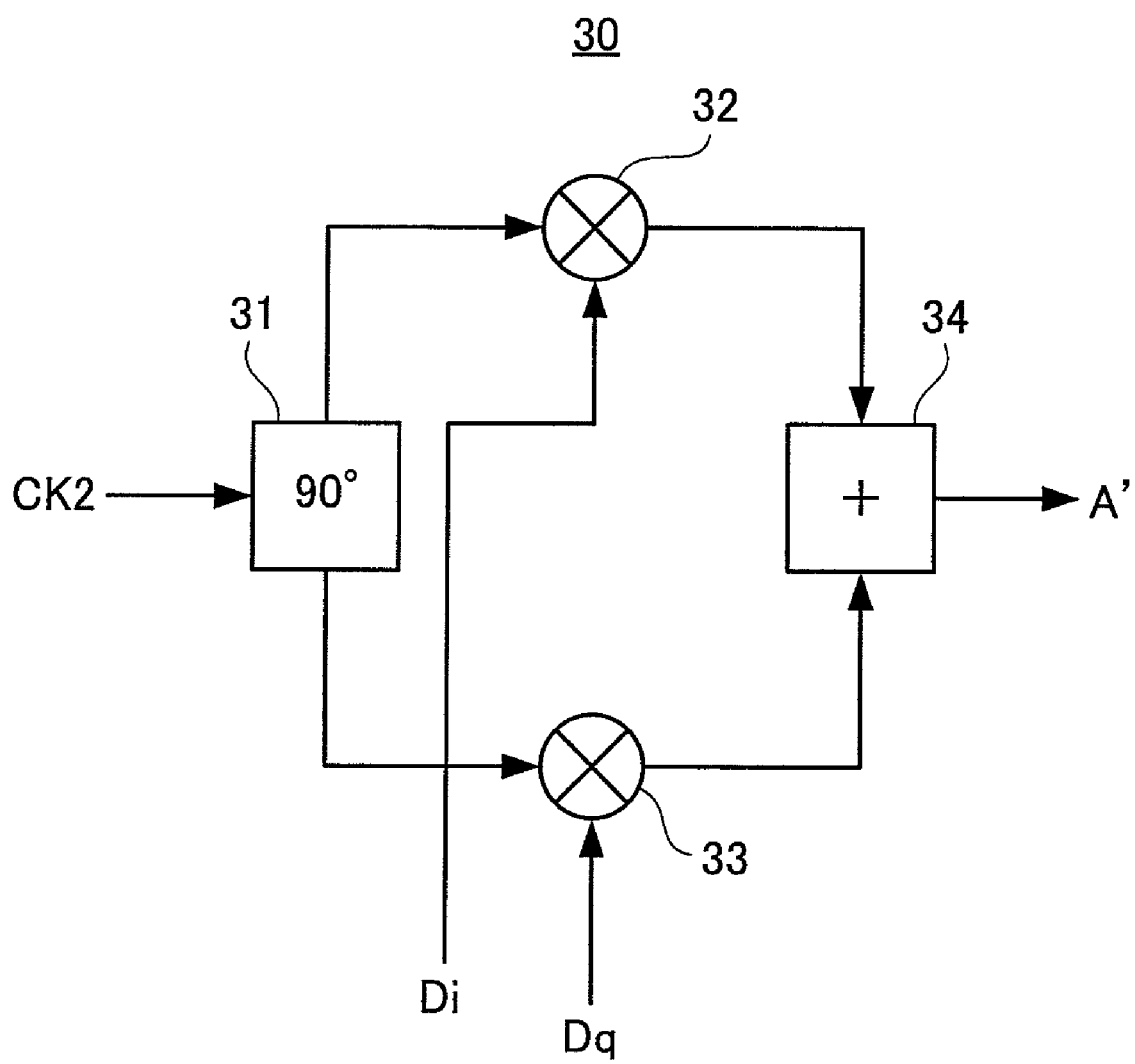
FIG. 3 is a block diagram showing the main portion of the data signal generating apparatus according to the first embodiment of the present invention.

As shown in FIG. 3, the frequency divided clock signal CK2 is divided into two different phase signals different 90 degrees in phase to be inputted to the mixers 32 and 33, respectively by the phase transfer device 31. The local signal input units of the mixers 32 and 33 are supplied with direct-current control signals Di and Dq corresponding to the desired delay times, and the output signals of the mixers 32 and 33 are added and compounded by an adder 34.

In the variable delay device 30 thus constructed, the output signal A of the adder 34 is given if the input signal (the frequency divided clock signal CK2), the control signal Di, and the control signal Dq are cos ωt, cos θ, and sin θ, respectively. The following explanation will be made about the case that the frequency of the signal to be inputted to the phase shifter 31 is equal to the frequency of the signal to be outputted from the phase shifter 31. The phase shifter 31 has a function to divide frequency in the case that the phase shifter 31 uses a flipflop as will hereinafter be described. In this case, the frequency of the output signal of the phase shifter 31 with respect to that of the input signal of the phase shifter 31 is $\frac{1}{2^n}$ ("n" is indicative of an integer more than one). Here, the adder 34 is used as compounding means for compounding the output of the mixers 32 and 33, however, may be replaced by a subtractor.

$$A = \cos\omega t \cdot \cos\theta + \sin\omega t \cdot \sin\theta$$
$$= [\cos(\omega t + \theta) + \cos(\omega t - \theta)]/2 - [\cos(\omega t + \theta) - \cos(\omega t - \theta)]/2$$
$$= \cos(\omega t - \theta)$$

Here, the signal A is equal to a signal delayed by an angle θ. The ratio between the angle θ and the direct control voltage signal is given as follows.

$$\theta = \tan^{-1}(Di/Dq)$$

The angle θ converted to the time is represented by $(\theta/2\pi)$ T2. Here, T2 is intended to indicate a period of the divided clock signal CK2. m·T1 if represented by the period T1 of the reference clock signal CK1.

Therefore, the delay time Ta corresponding to the angle θ is given as follows.

$$Ta = m(\theta/2\pi)T1$$

The control unit 26 is operative to input, to the variable delay device 30, the control signals Di and Dq for maintaining the previously mentioned equation to make coincident the phases of the two signals inputted to the phase comparator 16 within a certain acceptable range. More specifically, the control signals Di and Dq are made variable to bring the output voltage Vd of the phase comparator to the predetermined range by reducing the phase difference φ when the output voltage Vd of the phase comparator 16 is higher than the predetermined range, and by increasing the phase difference φ when the output voltage Vd of the phase comparator 16 is lower than the predetermined range as shown in FIG. 2.

For example, it is assumed that the divided clock signal CK2 shown in FIG. 4(b) is inputted to the variable delay device 30 in response to the reference clock signal CK1 shown in FIG. 4(a). When the delay time of the variable delay device 30 is zero, the divided clock signal CK2 is inputted to the data output unit 11 as a data request signal A' shown in FIG. 4(c), and from the data output unit 11, four bits of data updated at a delay time of Td from the input time of the data request signal A' is inputted to the multiplexer 13 as shown in FIGS. 4(d) to 4(g), and the data synchronization clock signal CKp in synchronism with this timing is outputted as shown in FIG. 4(h).

On the other hand, the multiplexer 13 is operated to output the data request signal A at a timing for example shown in FIG. 4(i), the data request signal A being inputted to the phase comparator 16 together with the data synchronization clock signal CKp. As shown in FIG. 4(j), the latch signal B is outputted from the multiplexer 13 at a delay time Δt from the output time of the data request signal A, the collective reading of the inputted data is performed as shown in FIGS. 4(k) to 4(n) to be outputted after being converted to the serial data as shown in FIG. 4(o).

Figure 4:
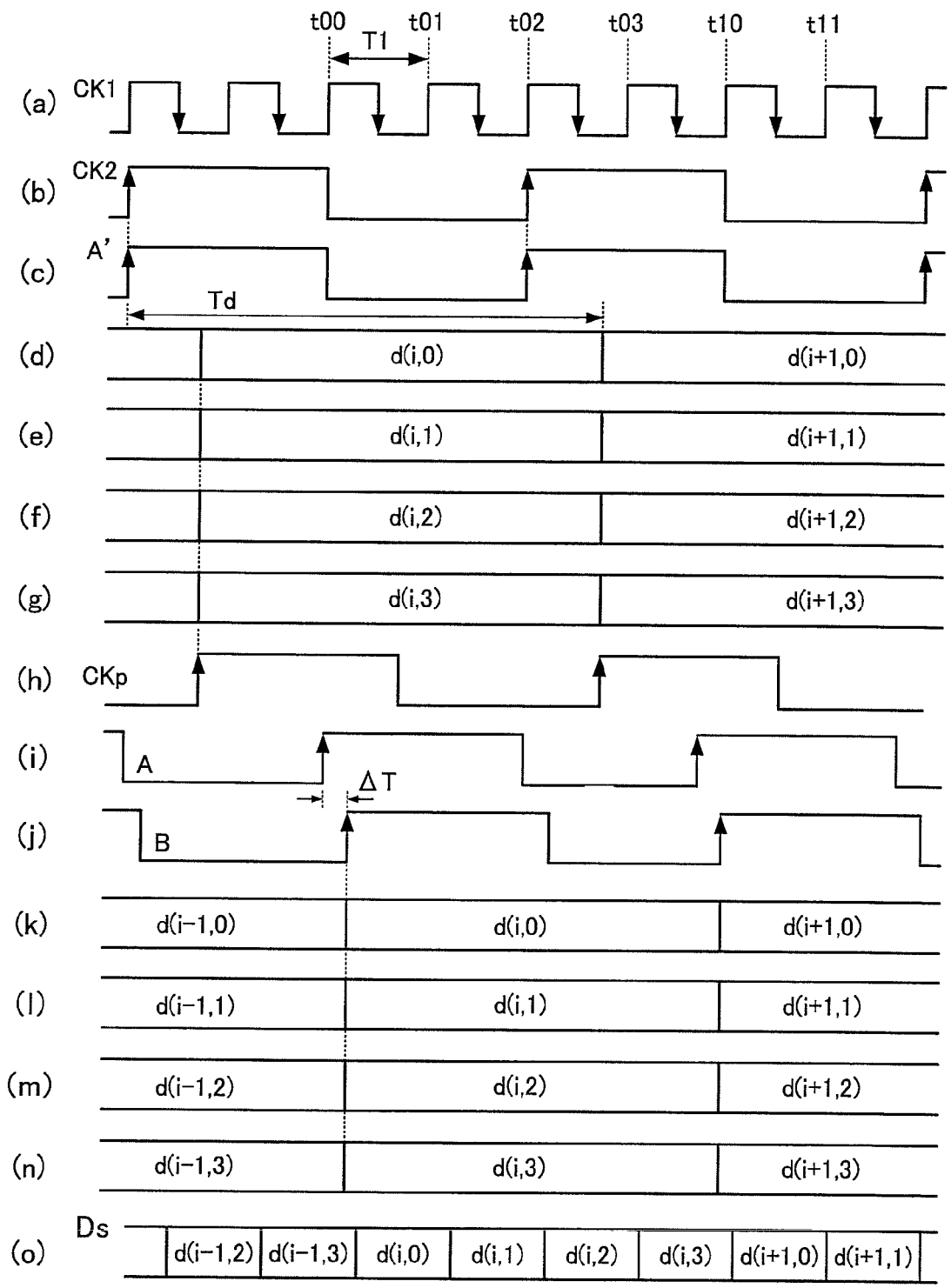
FIG. 4 is a timing chart for explaining the operation of the data signal generating apparatus according to the first embodiment of the present invention.

When the data request signal A is not the same in phase as the data synchronization clock signal CKp as shown in FIG. 4, the control unit 26 controls the variable delay device 30 to match the data request signal A with the data synchronization clock signal CKp.

The control operation of the control unit 26 causes the input timing of the data request signal A' to the data output unit 11 to be delayed as shown in FIG. 5(c), and thus causes the output timing of each of the data from the data output unit 11 to be delayed as shown in FIGS. 5(d) to 5(g). At this time, the data synchronization clock signal CKp in FIG. 5(h) comes to be in the phase incident to the phase of the data request signal A as shown in FIG. 5(i), viz., the addition of the delay time Ta and the delay time Td is equal to m·T1 (or the integral multiple of m·T1). This state is indicative of a synchronization state having the time difference of Δt always produced between the update timing of the data to be inputted to the multiplexer 13 and the timing of the reading by the latch signal B in FIG. 5(j) so that each of the data can be read in stable states to be converted to the serial data and outputted in a desired sequence as shown in FIG. 5(o).

Even if the reference clock signal CK1 is changed in frequency, the data signal generating apparatus 20 can respond accurately to the changing frequency by performing the synchronization control to maintain the above-mentioned relationship, and can deal with the wide range of data rate.

The data signal generating apparatus 20 can measure the jitter with a relatively high accuracy in comparison with the above-mentioned PLL control method causing a voltage controlled oscillator (VCO) to decrease the jitter.

In this embodiment, the multiplexer 13 is operative to convert the parallel data to the serial data after latching the parallel data all at once. The multiplexer 13, however, may be operative to latch the parallel data in a desired sequence by a time difference T1 in synchronization with the reference clock signal CK1 just after outputting the data request signal A, and to output it as the serial data. In this case, the data signal generating apparatus 20 according to the first embodiment can synchronize the data request signal A with the data synchronization clock signal CKp, and output the serial data in a desired sequence without matching the timing to update the parallel data with the timing to latch the parallel data.

Second Embodiment

Figure 6:
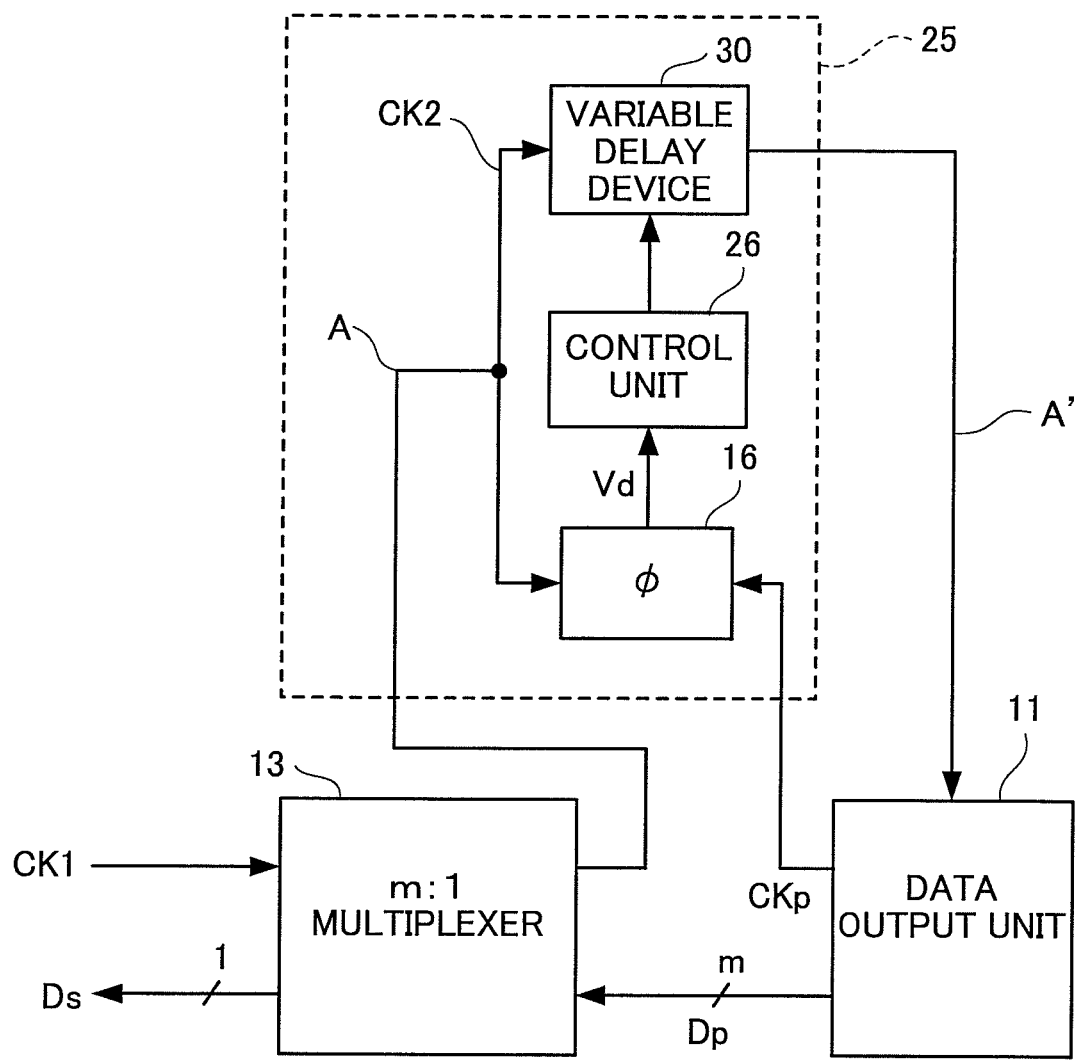
FIG. 6 is a block diagram showing the data signal generating apparatus according to the second embodiment of the present invention.

In the first embodiment, the frequency divider 15 is operative to produce a divided clock signal CK2 from a reference clock signal CK1 by dividing the frequency of the reference clock signal CK1, and to output the divided clock signal CK2 to the variable delay device 30. The frequency divider 15 can also serve as a controller 13a of the multiplexer 13. In this case, the controller 13a of the multiplexer 13b is operative to output the date request signal A to the phase comparator 16 and the variable delay device 30 as shown in FIG. 6. Therefore, the data signal generating apparatus 20 thus constructed is simple in construction.

Third Embodiment

Figure 7:
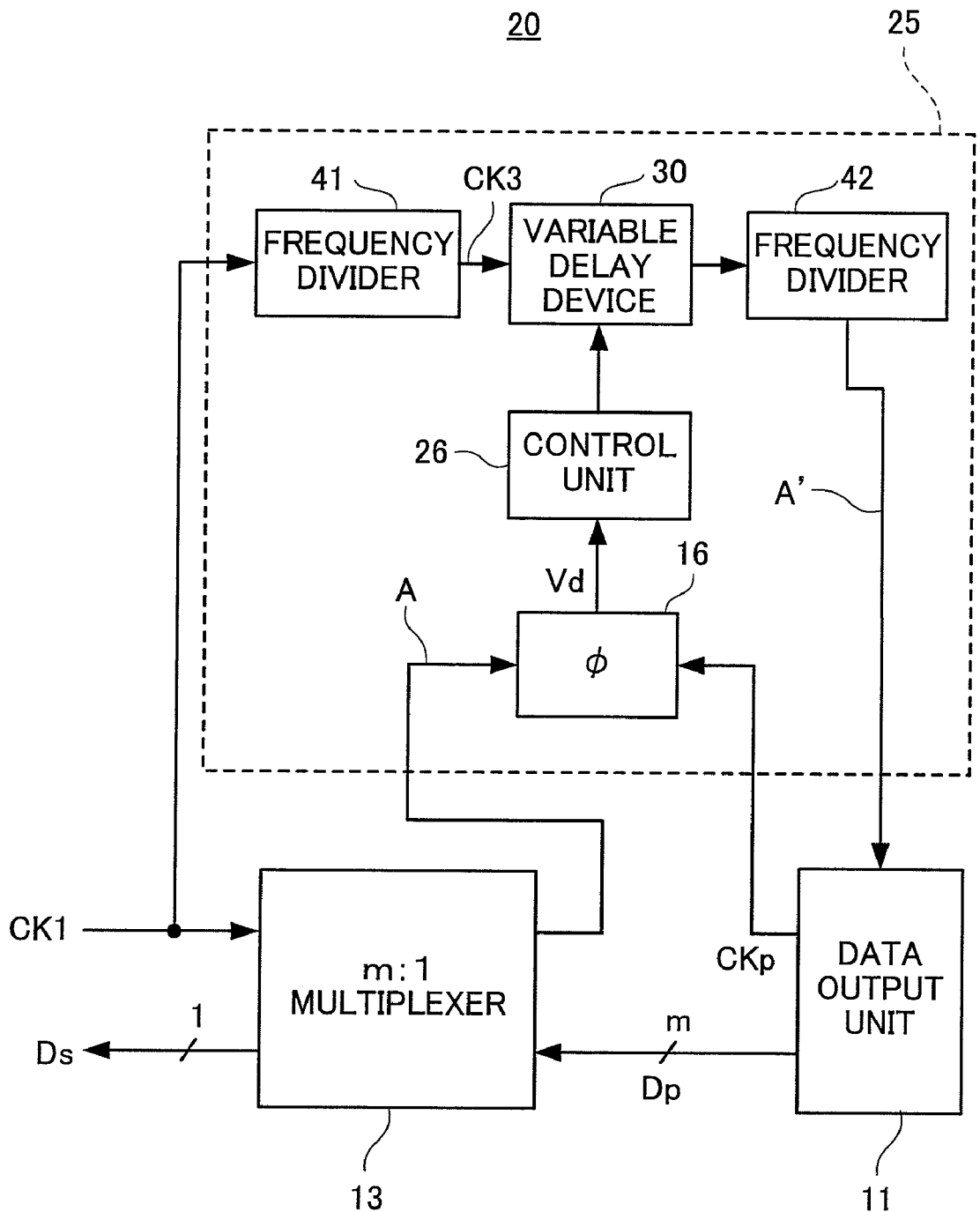
FIG. 7 is a block diagram showing the data signal generating apparatus according to the third embodiment of the present invention.

In the first embodiment, the frequency divider 15 is operative to produce a divided clock signal CK2 from a reference clock signal CK1 by dividing the frequency of the reference clock signal CK1 by a plural number m, and to output the divided clock signal CK2 to the variable delay device 30. As shown in FIG. 7, the data signal generating apparatus 20 according to the third embodiment may comprise two frequency dividers 41 and 42 and a variable delay device 30 provided between the frequency dividers 41 and 42. In this case, the dividing ratio of the frequency dividers 41 and 42 is given by m=Ma·Mb. The reference character Ma is intended to indicate the dividing ratio of the frequency divider 41, while the reference character Mb is intended to indicate the dividing ratio of the frequency divider 42.

The frequency divider 42 is behind the variable delay device 30. A value 2π·Mb needed to delay the phase of the data request signal A' by 2π is set to the data delay device 30. Therefore, the resolution power of the delay in the variable delay device 30 in the third embodiment is increased up to "Mb" times in comparison with that in the first embodiment.

Fourth Embodiment

The frequency divider 41 may be omitted in the data signal generating apparatus 20 shown in FIG. 7. The reference clock signal CK1 may be directly inputted into the variable delay device 30. The dividing number of the frequency divider 42 may be given by "m". As previously described, the delay in the variable delay device 30 is proportional to the period of the clock signal to be delayed by the variable delay device 30.

The frequency divider 41 is omitted in this embodiment. The dividing number of the frequency divider 42 is given by "m". The reference clock signal CK1 is inputted into the variable delay device 30. Therefore, the resolution power of the delay in the variable delay device 30 in the fourth embodiment is increased up to "m" times in comparison with that in the first embodiment.

Fifth Embodiment

Figure 8:
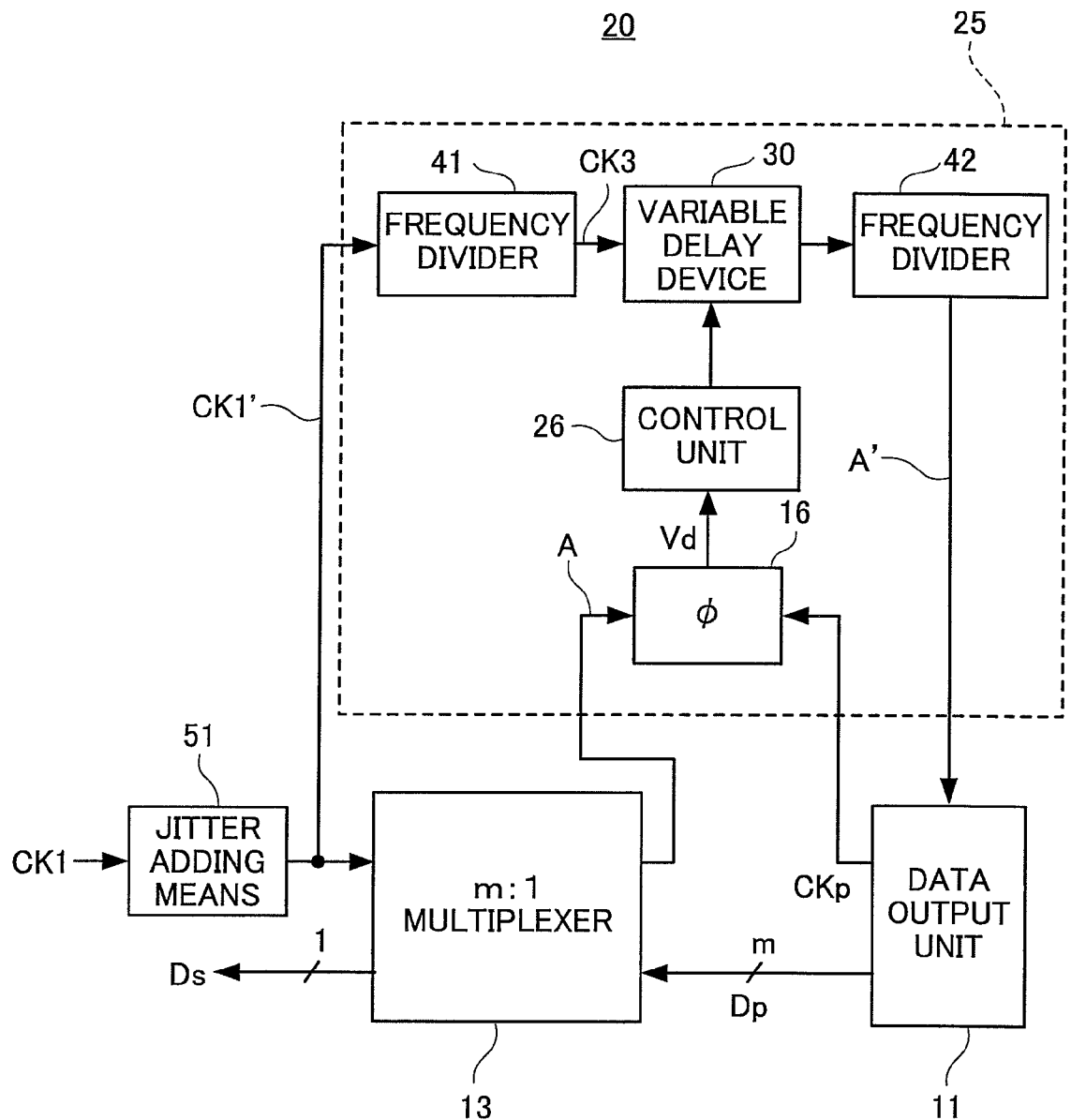
FIG. 8 is a block diagram showing the data signal generating apparatus according to the fifth embodiment of the present invention.

In the data signal generating apparatus 20 shown in FIG. 8, the reference clock signal CK1 may be inputted into jitter adding means 51 for producing a clock signal CK1' by adding jitter to the reference clock signal CK1. The clock signal CK1' is inputted to the synchronization means 25 and the multiplexer 13.

In the data signal generating apparatus 20 thus constructed, the clock signal CK1' produced by adding jitter to the reference clock signal CK1 is inputted into the data output unit 11. The parallel data based on jitter is produced in the data output unit 11. It is possible to measure jitter capacity or other characteristic of the object.

Sixth Embodiment

Figure 9:
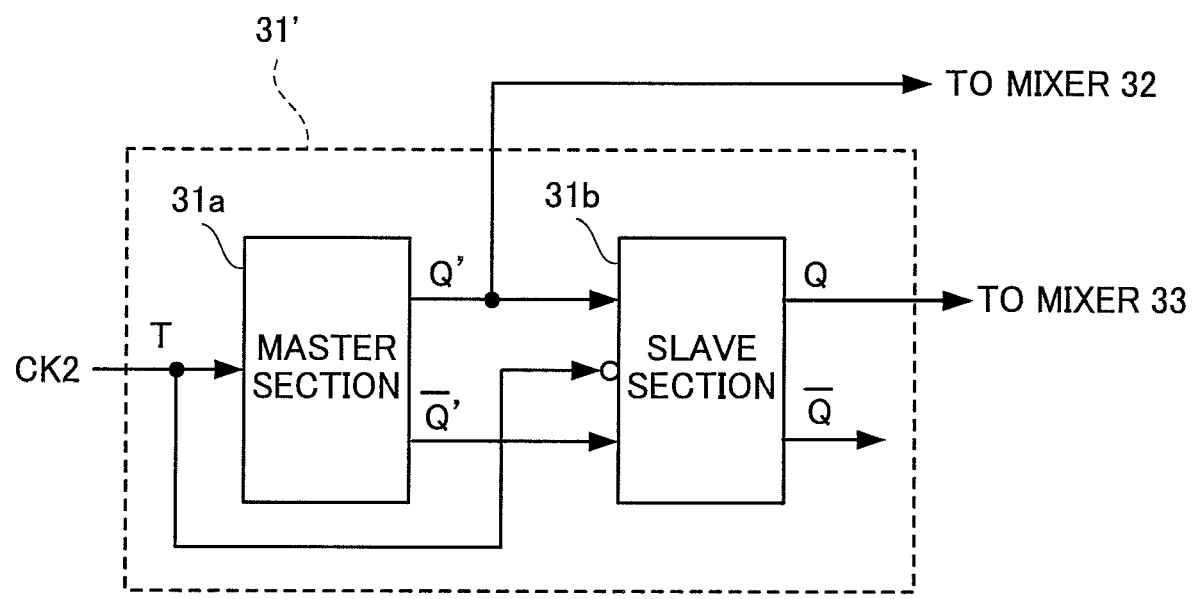
FIG. 9 is a block diagram showing the data signal generating apparatus according to the sixth embodiment of the present invention.

The phase shifter 31 of the variable delay device 30 shown in FIG. 3 may be constituted by a master-slave T-type flip-flop 31' shown in FIG. 9.

In this embodiment, the divided clock signal CK2 is inputted to the T-type flip-flop 31' through its input terminal T. The output signal Q' is outputted from a master section 31a to a mixer 32, while the output signal Q is outputted from a slave section 31b to a mixer 33. The output signals Q' and Q differs in phase from each other by 90 degrees.

The inputted signal is divided by two in the T-type flip-flop 31'. It is necessary to consider a dividing ratio of a frequency divider forming part of the synchronizing means 25 as well as the dividing ratio "2" of the phase shifter. In for example FIG. 1, the dividing ratio of the frequency divider 15 is equal to m/2.

The variable delay device is simple in construction. The data signal generating apparatus 20 thus constructed can operate properly even if the reference clock signal is relatively low, or close to zero.

In this embodiment, a 90-degree phase shifter is constituted by a flip-flop circuit. The 90-degree phase shifter is not limited by the above-mentioned example. For example, two clock signals may be produced by dividing the reference clock signal by four in two phase shifters connected in series. In general, the dividing ratio of the phase shifter constituted by flip-flop circuits is given by $2^n$ ("n" is indicative of an integer more than one). Therefore, the dividing ratio of a frequency divider forming part of the synchronizing means 25 may be set to $m/2^n$.

While there has been described in each embodiment about the fact that the variable delay device 30 is constituted by an orthogonal modulation type delay device, the variable delay device 30 may be constituted by a voltage control type device. In this case, the control unit 26 is operative to control the delay in the variable delay device 30 by outputting, to the variable delay device 30, a voltage based on the output signal Vd from the phase comparator 16.

Seventh Embodiment

Figure 10:
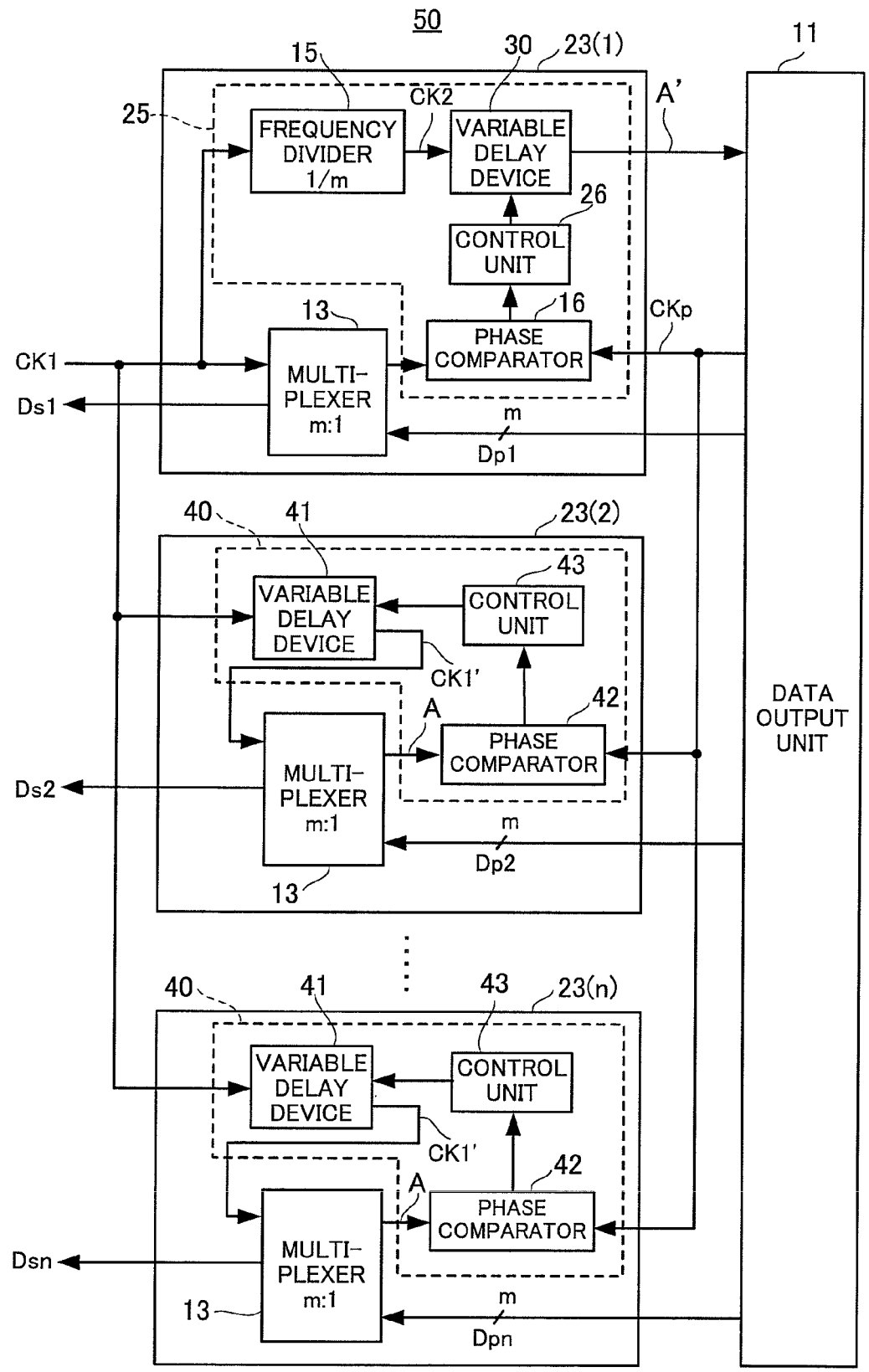
FIG. 10 is a block diagram showing the data signal generating apparatus according to the seventh embodiment of the present invention.
Figure 11:
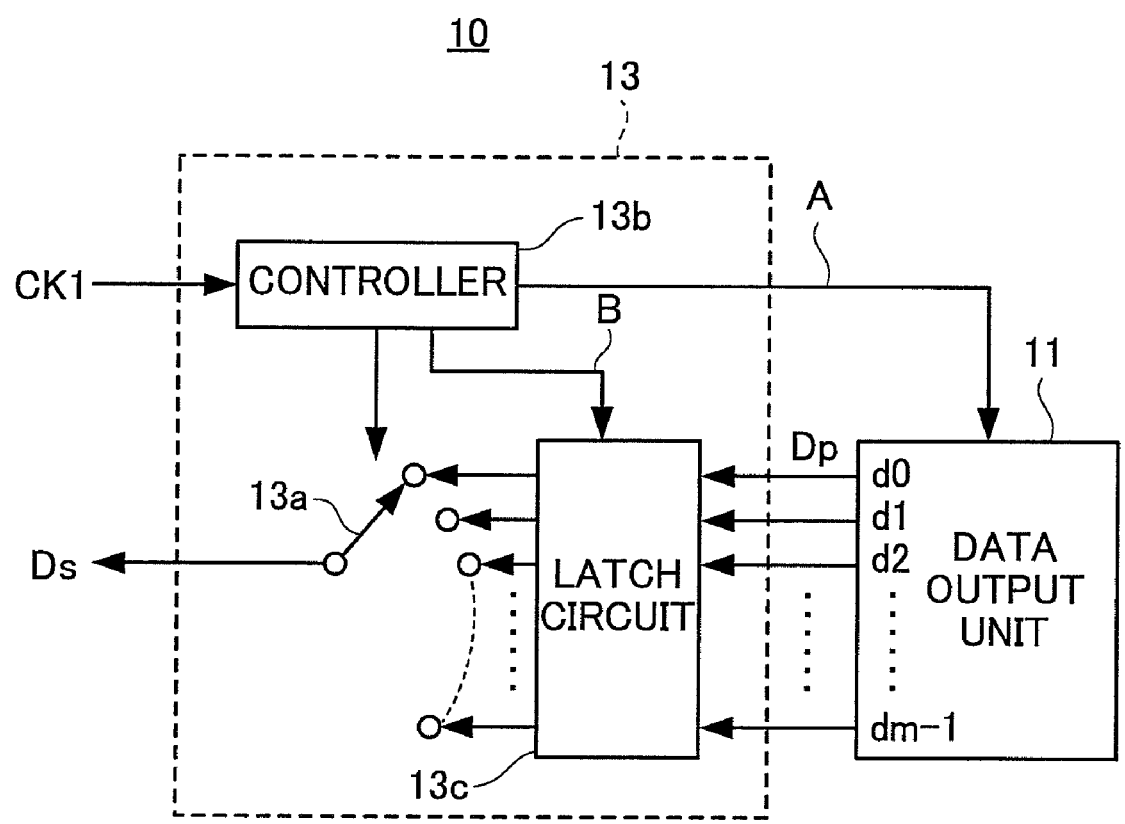
FIG. 11 is a block diagram showing the general construction of the conventional apparatus.
Figure 12:
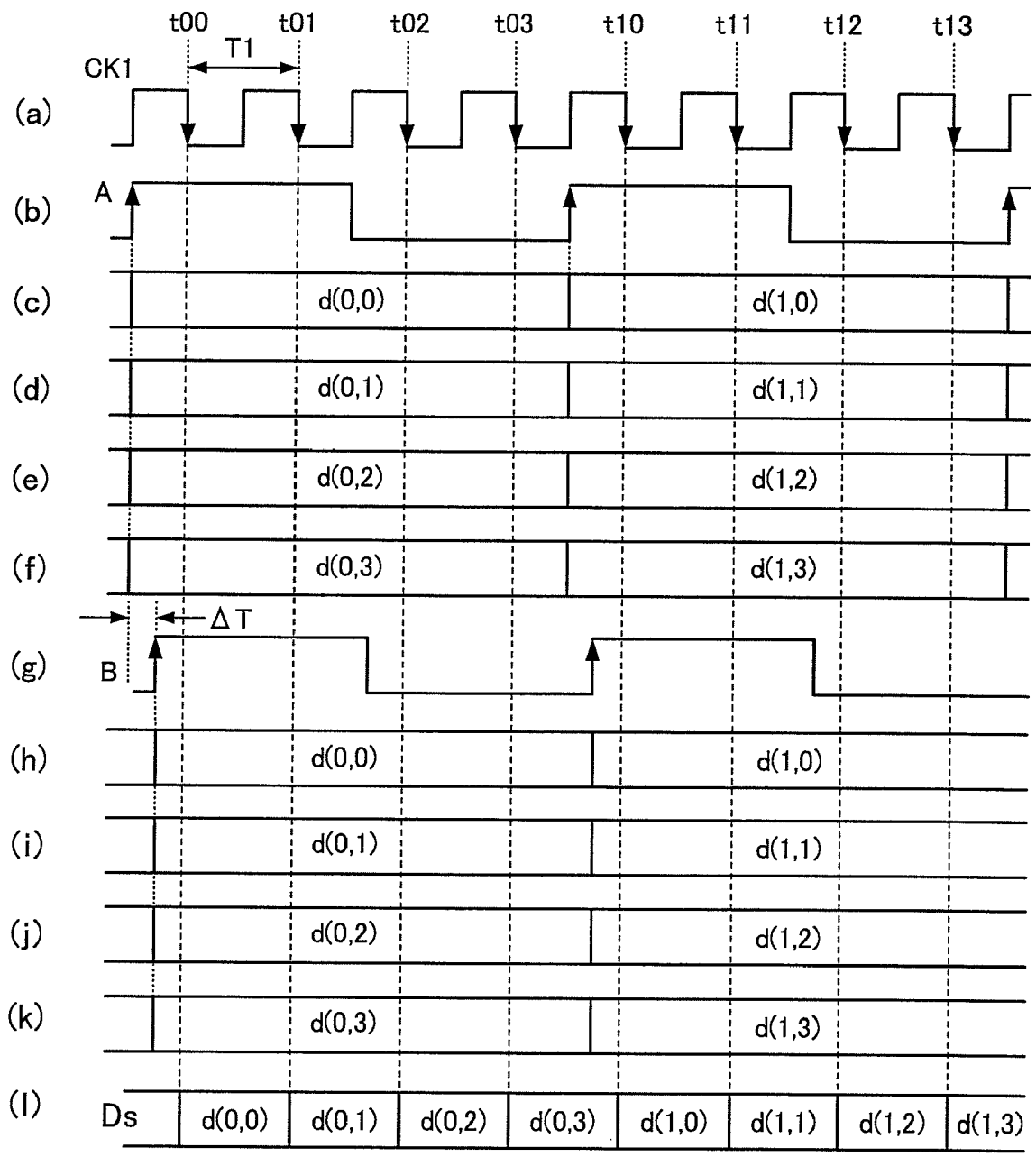
FIG. 12 is a timing chart showing an operation defined with no delay.
Figure 13:
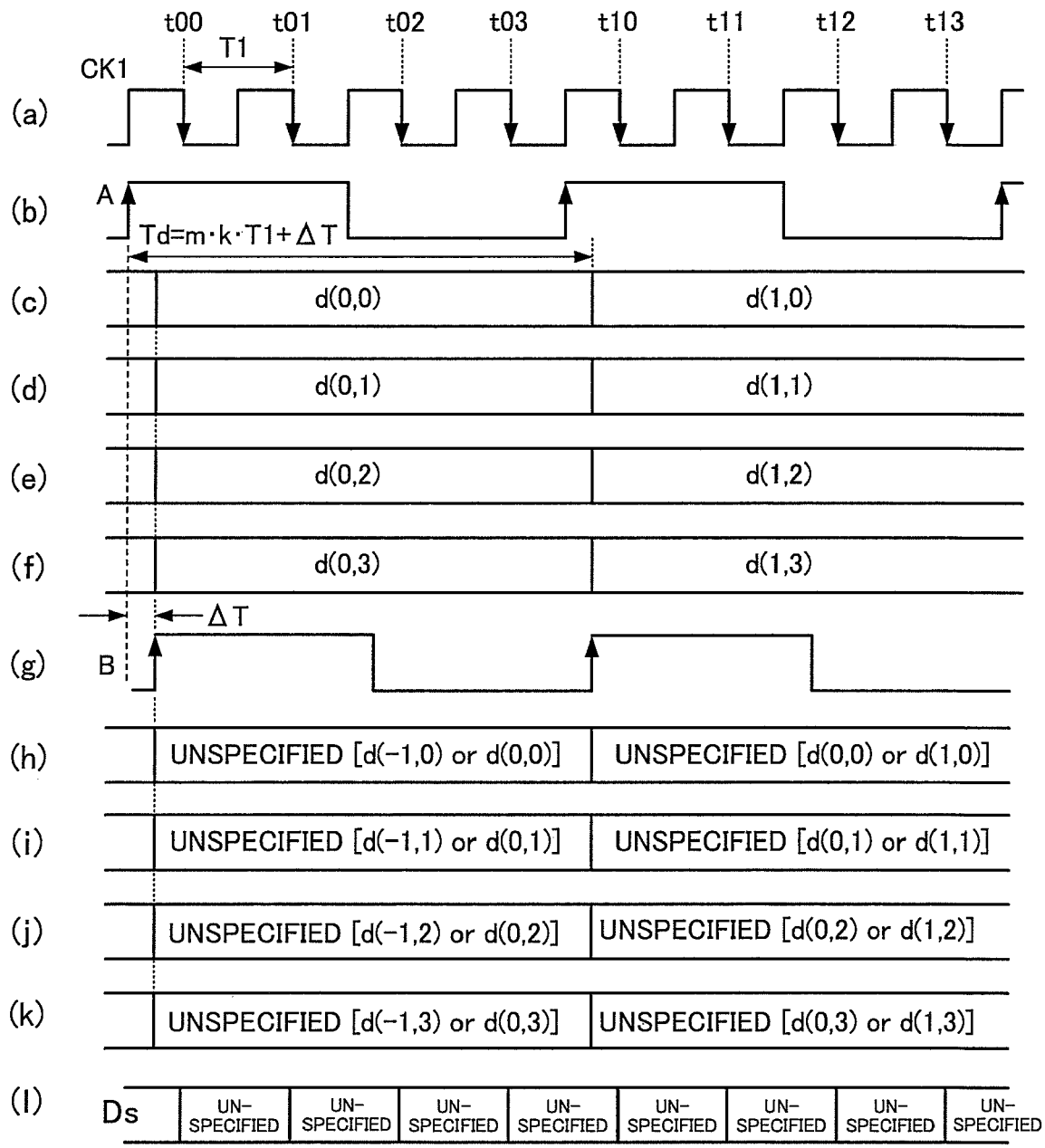
FIG. 13 is a timing chart showing an operation defined with delay.
Figure 14:
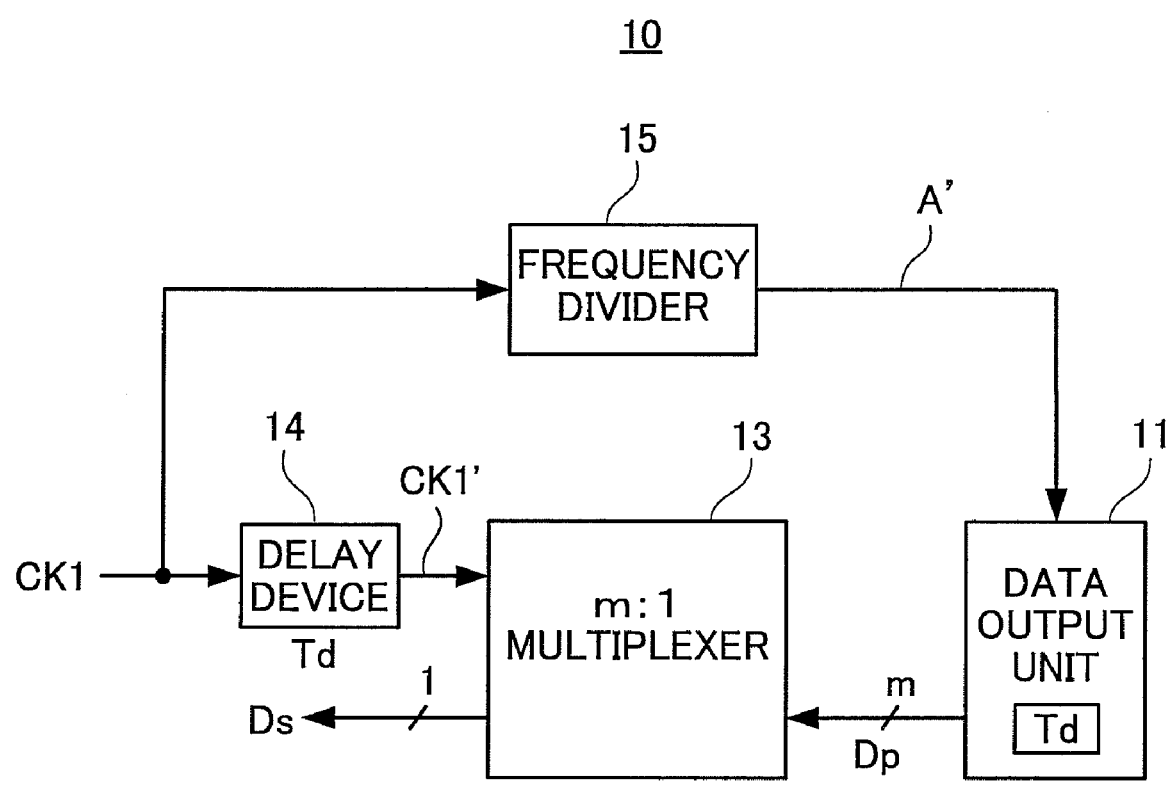
FIG. 14 is a block diagram showing an example of a synchronizing method using a delay device.
Figure 15:
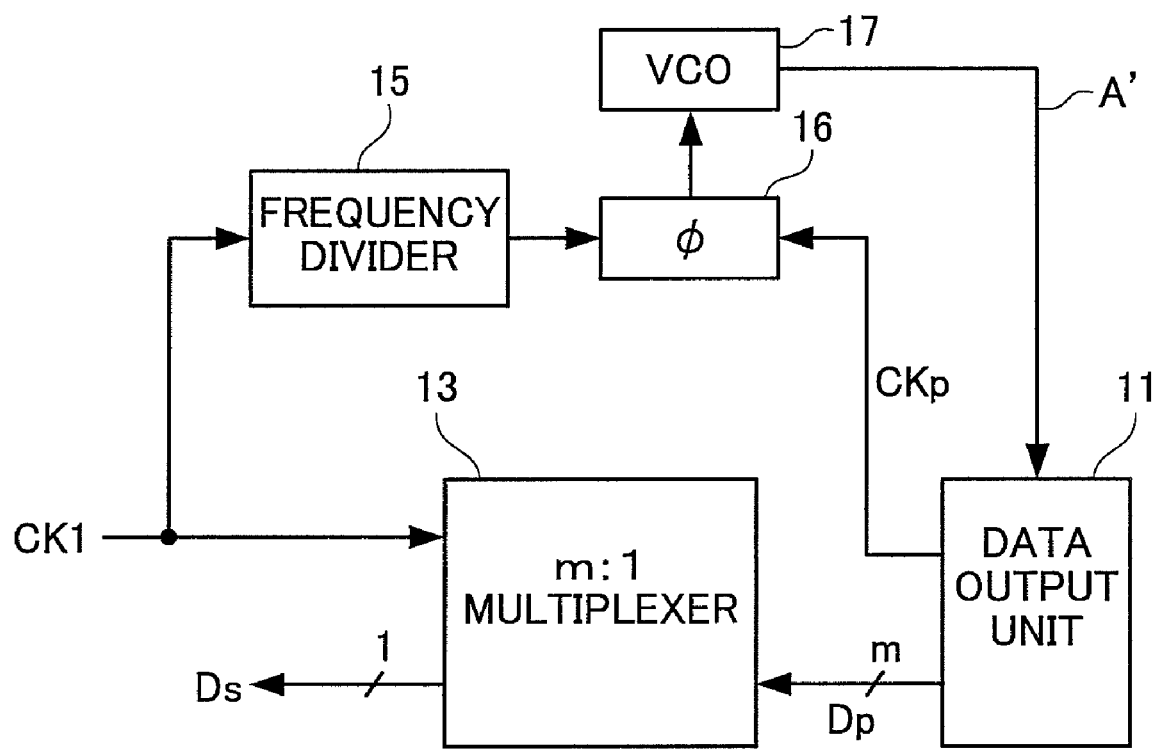
FIG. 15 is a block diagram showing an example of a method of synchronizing with a PLL system.

FIG. 10 is a block diagram showing a data signal generating apparatus 50 according to the seventh embodiment of the present invention. The constituent elements of the data signal generating apparatus 50 according to the seventh embodiment the same in construction as those of the data signal generating apparatus 20 according to the first embodiment will not described hereinafter but bear the same reference numerals as those of the data signal generating apparatus 20 according to the first embodiment.

In this embodiment, the data output unit 11 is operative to output m-bit parallel data Dp to a plurality of data conversion units 23(1) to 23(n) every time receiving a data request signal A' produced by dividing the frequency of the reference clock signal CK1 by a plural number "m".

Here, the data conversion unit 23(1) is constituted by the synchronizing means 25 and the multiplexer 13 which have been described in the first embodiment. Each of the data conversion units 23(1) to 23(n) has a m:1 multiplexer 13. The data conversion units 23(1) to 23(n) receive the respective m-bit parallel data Dp2 to Dpn from the data output unit 11, convert m-bit parallel data Dp2 to Dpn into serial data Ds2 to Dsn to be outputted at a rate the same as that of the reference clock signal CK1.

Each of the data conversion units 23(2) to 23(n) has systematically-expanded synchronization means 40 for controlling the delay of the reference clock signal CK1 to be inputted into its multiplexer 13 to synchronize the time to have its data output unit 11 update the parallel data with the parallel-serial conversion in its multiplexer 13.

The systematically-expanded synchronization means 40 has a variable delay device 41 for delaying the reference clock signal CK1, a phase comparator 42 for detecting the phase difference between the data synchronization clock signal CKp to be outputted from the data output unit 11 and the data request signal to be outputted from the multiplexer 13 in response to the reference clock signal CK1' delayed by the variable delay device 41, and a control unit 43 for controlling the delay of the reference clock signal CK1 in the variable delay device 41 in a direction required to match the phase of the data request signal A with the data synchronization clock signal CKp.

Here, this variable delay device 41 is constituted by an orthogonal modulation type delay device the same in construction as that of the variable delay device 30, and has a phase shifter 41a, mixers 41b and 41c, and an adder 41d. The delay of the reference clock signal CK1 in the variable delay device 41 is controlled by a direct control signal from the control unit 43.

The delay of the reference clock signal CK1 can be changed by the variable delay device 41 under the condition that the delay is larger than the period T1 of the reference clock signal CK1. The delay time larger than m·T1 can be changed by the variable delay device 41.

The systematically-expanded synchronization means 40 is required to output the serial data Ds2 to Dsn synchronized with the serial data Ds1 to be outputted from the data conversion units 23(1). Therefore, it is preferable to control the variable delay device 41 to reduce the phase difference between the data synchronization clock signal CKp and the latch signal close to zero with a relatively high accuracy.

The systematically-expanded synchronization means 40 is operative to synchronize each of the data conversion units 23(2) to 23(n) with the data synchronization clock signal CKp, and to assume a state in which each of the data conversion units 23(1) to 23(n) is synchronized with the data output unit 11.

Additionally, the data synchronization signals CKp to be respectively outputted to the data conversion units 23(1) to 23(n) from the data output unit 11 are the same in phase as one another. On the other hand, the reference clock signals CK1 to be respectively inputted into the data conversion units 23(1) to 23(n) may be different in phase from one another. Even if the reference clock signals CK1 different in phase from one another are respectively inputted into the data conversion units 23(1) to 23(n), the variable delay device 41 of the systematically-expanded synchronization means 40 can absorb their phase deviation.

The data signal generating apparatus 50 according to the seventh embodiment can dramatically reduce the time needed to assume a synchronizing state, and output a desired n-channel serial data within a relatively short time in comparison with the conventional synchronizing method, by reason that the first synchronization means 25 is operative to control the delay of the data request signal A' to be inputted into the data output unit 11 to synchronize the data conversion unit 23(1) with the data output unit 11, the systematically-expanded synchronization means 40 is operative to control the delay of the reference clock signal CK1 to be inputted into the multiplexer 13 to synchronize the data conversion units 23(2) to 23(n).

Further, the data signal generating apparatus 50 according to the seventh embodiment may be operative to receive the data synchronization clock signal CKp from an external. Each of the data conversion units 23(1) to 23(n) may have a multiplexer 13 and a systematically-expanded synchronization means 40.

While there has been described in this embodiment about the fact that the data conversion unit 23(1) has a multiplexer 13, a frequency divider 15, a phase comparator 16, a control unit 26, and a variable delay device 30 explained in the first embodiment, the data conversion unit 23(1) may have synchronization means 25 and a multiplexer 13 explained in any one of the second to sixth embodiments.

Figure 5:
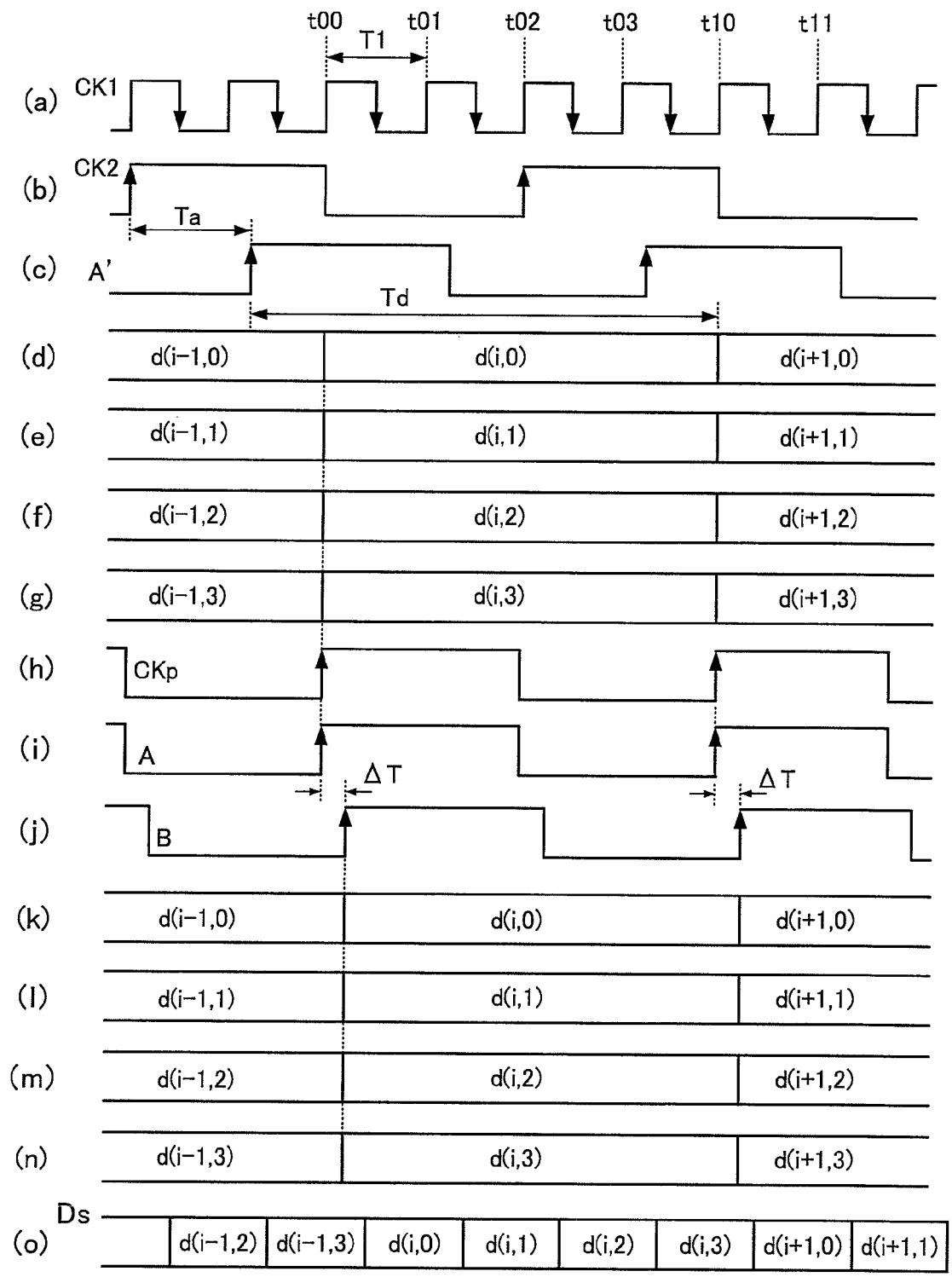
FIG. 5 is another timing chart for explaining the operation of the main portion of the data signal generating apparatus according to the first embodiment of the present invention.

As have been explained in the foregoing description, the total delay is set to about for example 100 ps in the variable delay device 30, by reason that it is only necessary to control the data output unit 11 not to match the timing to update the parallel data (c) to (f) with the leading edge of the latch signal B as shown in FIG. 5.

On the other hand, the total delay is relatively large in the variable delay device 41, and reaches (1/100 MHz)·m=10 ns×m under the condition that the reference clock CK1 is given within a relatively wide frequency range, for example, 100 MHz to 12.5 GHz. Here, the reference character "m" is intended to indicate a dividing ratio. In this case, it is preferable that the variable delay device 41 be constituted by an orthogonal modulation type delay device.

The invention claimed is:

1. A data signal generating apparatus comprising:
a data output unit for outputting m-bit parallel data and a data synchronization clock signal synchronized with said m-bit parallel data in response to a data request signal produced by dividing the frequency of a reference clock signal by a plural number "m";
a m:1 multiplexer for receiving said m-bit parallel data from said data output unit in response to a latch signal produced by dividing said frequency of said reference clock signal by said plural number "m", and outputting, at a rate of said reference clock signal, a data synchronization serial data produced from said m-bit parallel data; and
synchronization means having a phase comparator for comparing the phase of said data synchronization clock signal with the phase of said latch signal, said synchronization means being operative to synchronize said m-bit parallel data outputted from the data outputting unit with said latch signal,
wherein said synchronization means includes: a control unit for producing a control signal based on a comparing result obtained by said phase comparator; and a variable delay device for delaying, on the basis of said control signal, said reference clock signal or a divided clock signal produced by dividing said frequency of said reference clock signal by a number equal to or smaller than said plural number "m", and
wherein said variable delay device functions as an orthogonal modulation type delay device.

2. The data signal generating apparatus according to claim 1, wherein said variable delay device includes:
a phase shifter for receiving, as an input signal, said reference clock signal or said divided clock signal produced by dividing said frequency of said reference clock signal by said number equal to or smaller than said plural number "m", and outputting two signals different in phase from each other by 90 degrees;
a first mixer for multiplying one of said signals outputted from said phase shifter by a first direct voltage;
a second mixer for multiplying the other of said signals outputted from said phase shifter by a second direct voltage; and
adding means for outputting a signal produced by adding an output signal of said first mixer to an output signal of said second mixer, and delayed on the basis of a ratio of said first and second direct voltages.

3. The data signal generating apparatus according to claim 2, wherein said phase shifter is constituted by a flip-flop circuit for outputting two signals different in phase from each other by 90 degrees.

\* \* \* \* \*